US009666461B1

(12) United States Patent
Lin et al.

(10) Patent No.: US 9,666,461 B1
(45) Date of Patent: May 30, 2017

(54) SEMICONDUCTOR PROCESS AND SEMICONDUCTOR PROCESSING DEVICE USING THE SAME

(71) Applicant: Taiwan Semiconductor Manufacturing Co., Ltd., Hsinchu (TW)

(72) Inventors: Yii-Cheng Lin, Hsinchu (TW); Chih-Ming Sun, New Taipei (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/016,275

(22) Filed: Feb. 5, 2016

(51) Int. Cl.
*H01L 21/67* (2006.01)
*H01L 21/306* (2006.01)
*B08B 9/08* (2006.01)

(52) U.S. Cl.
CPC .......... *H01L 21/67161* (2013.01); *B08B 9/08* (2013.01); *H01L 21/30604* (2013.01); *H01L 21/67063* (2013.01); *H01L 21/67207* (2013.01)

(58) Field of Classification Search
None
See application file for complete search history.

(56) References Cited

U.S. PATENT DOCUMENTS

| 5,085,410 | A * | 2/1992 | Ficnh | H01J 37/18 204/157.22 |
|---|---|---|---|---|
| 5,223,112 | A * | 6/1993 | Tepman | C23C 14/564 204/298.11 |
| 5,364,219 | A * | 11/1994 | Takahashi | H01L 21/67724 118/719 |
| 5,468,686 | A * | 11/1995 | Kawamoto | H01L 21/32139 216/66 |
| 5,620,578 | A * | 4/1997 | Hurwitt | C23C 14/564 118/719 |
| 5,826,129 | A * | 10/1998 | Hasebe | H01L 21/67173 396/611 |
| 6,090,718 | A * | 7/2000 | Soga | H01L 21/67069 134/1.1 |
| 6,095,741 | A * | 8/2000 | Kroeker | F16K 3/18 251/193 |
| 6,235,171 | B1 * | 5/2001 | Yamamoto | B82Y 25/00 118/719 |
| 6,267,545 | B1 * | 7/2001 | Mooring | F16K 3/18 414/217 |
| 6,364,593 | B1 * | 4/2002 | Hofmeister | H01L 21/67772 414/217.1 |
| 6,558,506 | B1 * | 5/2003 | Freeman | H01L 21/67063 156/345.31 |
| 6,649,020 | B1 * | 11/2003 | Okamura | C23C 16/509 118/719 |
| 6,754,554 | B2 * | 6/2004 | Yamauchi | G05B 19/0428 700/117 |
| 8,367,565 | B2 * | 2/2013 | Lei | B05D 3/04 414/935 |

(Continued)

*Primary Examiner* — Allan Olsen
(74) *Attorney, Agent, or Firm* — Jianq Chyun IP Office

(57) ABSTRACT

A semiconductor processing device includes a first etching chamber, a second etching chamber, and an etching module. The etching module is adapted to interchangeably contain the first etching chamber or the second etching chamber for wafer etching. A semiconductor process using the semiconductor processing device is also provided.

16 Claims, 6 Drawing Sheets

(56) References Cited

U.S. PATENT DOCUMENTS

| | | | |
|---|---|---|---|
| 2003/0220708 A1* | 11/2003 | Sahin | H01L 21/67253 700/121 |
| 2004/0007325 A1* | 1/2004 | Pan | H01L 21/67161 156/345.1 |
| 2004/0060573 A1* | 4/2004 | Woods | C25D 5/22 134/1.3 |
| 2004/0206621 A1* | 10/2004 | Li | H01L 21/67161 204/229.8 |
| 2012/0164832 A1* | 6/2012 | Chandrashekar | C23C 16/14 438/680 |

* cited by examiner

SEMICONDUCTOR PROCESS AND SEMICONDUCTOR PROCESSING DEVICE USING THE SAME

BACKGROUND

In wafer etching processes, the chamber in which the wafer is etched may accrue byproducts that are deposited on the chamber wall after the wafer is etched. A cleaning process to clean the chamber removes the byproducts on the chamber wall, and then the wafer etching process continues.

However, the process of cleaning the chamber to remove the byproducts takes a significant amount of time. During the cleaning process, the chamber is unable to etch other wafers. Thus, the cleaning process reduces the efficiency and productivity of the chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
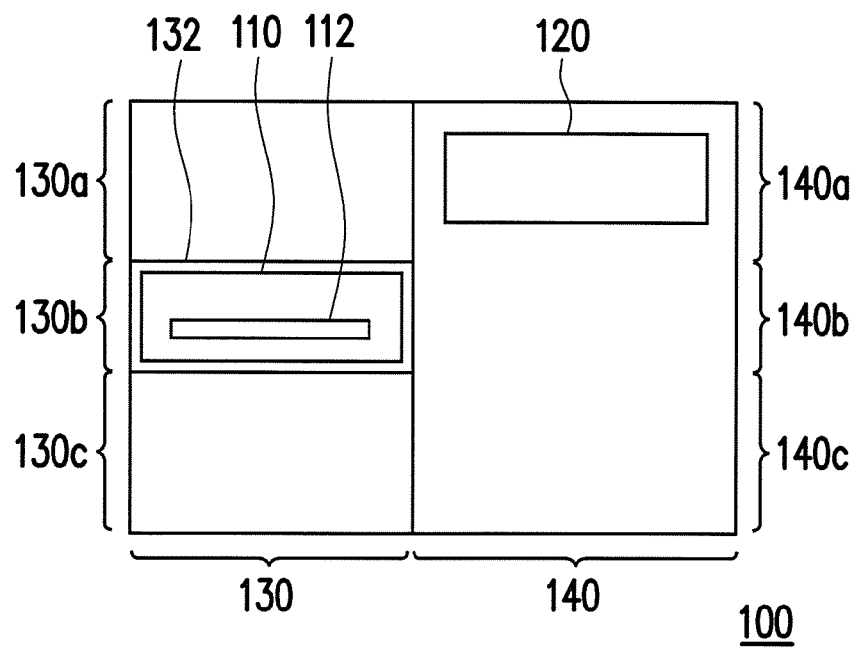
FIG. 1A to FIG. 1G are schematic diagrams of a semiconductor processing device performing a semiconductor process according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are schematic diagrams of a semiconductor processing device performing a semiconductor process according to some embodiments of the present disclosure. Referring to FIG. 1A, a semiconductor processing device 100 includes a first etching chamber 110, a second etching chamber 120, and an etching module 130. Each of the first etching chamber 110 and the second etching chamber 120 are adapted to include a wafer for etching. In some embodiments, the etching module 130 includes a slot 132, adapted to contain the first etching chamber 110 or the second etching chamber 120 for wafer etching. That is to say, in some embodiments, the slot 132 of the etching module 130 only includes one etching chamber, either the first etching chamber 110 or the second etching chamber 120. However, the present disclosure is not limited thereto. One of ordinary skill in the art may design the slot 132 of the etching module 130 to include more than one etching chamber.

In some embodiments, the etching module 130 is adapted to interchangeably contain the first etching chamber 110 or the second etching chamber 120 in the slot 132 for wafer etching. That is to say, when the first etching chamber 110 contains a wafer to be etched, the first etching chamber 110 is disposed in the slot 132 of the etching module 130 for wafer etching. In the same way, when the second etching chamber 120 contains a wafer to be etched, the second etching chamber 120 is disposed in the slot 132 of the etching module 130 for wafer etching. In some embodiments, when the first etching chamber 110 is disposed in the slot 132, the second etching chamber 120 is disposed outside the etching module 130. Similarly, when the second etching chamber 120 is disposed in the slot 132, the first etching chamber 110 is disposed outside the etching module 130.

In some embodiments, the semiconductor processing device 100 further includes a transfer module 140. The transfer module 140 is disposed adjacent to the etching module 130. The transfer module 140 is adapted to contain the first etching chamber 110 or the second etching chamber 120 for cleaning when the first etching chamber 110 or the second etching chamber 120 in the transfer module 140 is in a waferless state. That is to say, the transfer module 140 contains either the first etching chamber 110 or the second etching chamber 120 for cleaning when the first etching chamber 110 or the second etching chamber 120 in the transfer module 140 does not include a wafer. The cleaning process performed in the transfer module 140 toward either the first etching chamber 110 or the second etching chamber 120 is adapted to remove the byproducts (not shown) deposited on the etching chamber (for example, the first etching chamber 110 or the second etching chamber) that has undergone a wafer etching process or etching process. During the wafer etching process, byproducts may be deposited on the walls of the etching chamber that need to be cleaned in order to continue etching additional wafers. Therefore, the cleaning process must be performed to remove the byproducts. In some embodiments, the cleaning process is a waferless autocleaning process. However, the disclosure is not limited thereto. The cleaning process may be any cleaning process known to one of ordinary skill in the art for cleaning etching chambers that removes byproducts.

In some embodiments, when the first etching chamber 110 and the second etching chamber 120 are to be interchanged in the etching module 130, the transfer module 140 is adapted to contain both the first etching chamber 110 and the second etching chamber 120. The transfer module 140 aligns one of the first etching chamber 110 and the second etching chamber 120 to the slot 132 of the etching module 130 to then move the aligned one of the first etching chamber 110 and the second etching chamber 120 into the slot 132.

In addition, in some embodiments the etching module 130 has an upper section 130a, a middle section 130b, and a lower section 130c (only shown in FIG. 1A). The slot 132 is located in the middle section 130b of the etching module 130 so that the etching chamber (for example the first etching chamber 110 or the second etching chamber 120) located in the slot 132 is a middle etching chamber. In some embodiments, during the wafer etching process, byproducts are mostly deposited in the middle etching chamber. Thus, the middle etching chamber needs to be cleaned after the wafer etching process. The first etching chamber 110 and the second etching chamber 120 are identical to each other, and can be interchanged in the slot 132 located in the middle section 130b of the etching module 130 so that whichever etching chamber is located in the slot 132 is the middle etching chamber. When the middle etching chamber needs to be cleaned, the other identical etching chamber (the first etching chamber 110 or the second etching chamber 120 not located in the slot 132) can be switched so as to continue the wafer etching process while the middle etching chamber that is switched out can be cleaned. This way, the etching module 130 can continue the wafer etching process without a loss in time. That is to say, the middle etching chamber with the byproducts that needs to be cleaned is cleaned outside the etching module 130, and the identical etching chamber is switched to be the middle etching chamber in the etching module 130 to continue the etching process. Therefore, by being able to switch identical etching chambers (for example, the first etching chamber 110 and the second etching chamber 120), the etching module 130 can proceed with the wafer etching process while one of the etching chambers is cleaned at the same time. Having the wafer etching process and the cleaning process performed at the same time allows the wafer etching process to continue without having to stop and wait for the etching chamber (for example, the first etching chamber 110 and the second etching chamber 120) to be cleaned. This reduces the non-productivity time of the etching module 130, and the wafer etching process may be more efficient and productive in the etching module 130. Of course, the wafer etching process is not limited to being performed at the same time as the cleaning process of cleaning the other etching chamber. The cleaning process and the wafer etching process may also be performed at independent times with respect to each other.

In some embodiments, the upper section 130a and the lower section 130c of the etching module 130 may also include additional slots (not shown). The additional slots may hold additional etching chambers or other suitable components. However, the disclosure is not limited thereto. One of ordinary skill in the art may include or omit additional slots in the upper section 130a and the lower section 130c of the etching module 130 according to design requirements. In this case, the upper section 130a and the lower section 130c may be a vacuum. Furthermore, if the additional slots are included in either the upper section 130a or the lower section 130c or both, one of ordinary skill in the art may selectively include additional etching chambers or other suitable components.

Referring to FIG. 1A to FIG. 1G, FIG. 1A to FIG. 1G are schematic diagrams of a semiconductor processing device performing a semiconductor process according to some embodiments of the present disclosure. In detail, as seen in FIG. 1A, in the semiconductor process, the first etching chamber 110 is disposed in the slot 132 located in the middle section 130b of the etching module 130. A wafer 112 disposed in the first etching chamber 110 may be undergoing a wafer etching process. The transfer module 140 includes the second etching chamber 120. In FIG. 1A, the second etching chamber 120 disposed in the transfer module 140 may be undergoing a cleaning process. That is to say, the second etching chamber 120 may have previously been disposed in the etching module 130 for the wafer etching process. However, the second etching chamber 120 may also be a clean chamber disposed in the transfer module 140 that has not undergone any wafer etching process yet. It should be noted that the second etching chamber 120 is in a waferless state. That is to say, the second etching chamber 120 does not include a wafer so as to undergo the cleaning process.

Furthermore, as seen in FIG. 1A, the transfer module 140 also includes an upper section 140a, a middle section 140b, and a lower section 140c (only shown in FIG. 1A). It can be seen that the second etching chamber 120 is located in the upper section 140a of the transfer module 140. That is to say, the cleaning process performed in the transfer module 140 is performed in the upper section 140a of the transfer module 140. However, the disclosure is not limited thereto. One of ordinary skill in the art may perform the cleaning section in the middle section 140b or the lower section 140c of the transfer module 140 if desired.

In some embodiments, the cleaning process performed in the transfer module 140 is done simultaneously with the wafer etching process performed in the etching module 130. The cleaning process and the wafer etching process may be performed at the same time in order to increase the wafer etching productivity of the etching module 130. However, the disclosure is not limited thereto. The cleaning process in the transfer module 140 is performed independently from the wafer etching process performed in the etching module 130. Therefore, the cleaning process does not have be performed at the same time as the wafer etching process. The timing of each process may be determined according to the user requirements.

Furthermore, in some embodiments, the cleaning process of the etching chamber does not have to be performed in the transfer module 140. That is to say, the transfer module 140 may be omitted and the cleaning process of the second etching chamber 120 may take place in another suitable component for cleaning the second etching chamber 120 (or any etching chamber to be cleaned). The disclosure is not limited thereto. One of ordinary skill in the art may include the transfer module 140 or omit the transfer module 140 as required by the user.

Figure 1B:
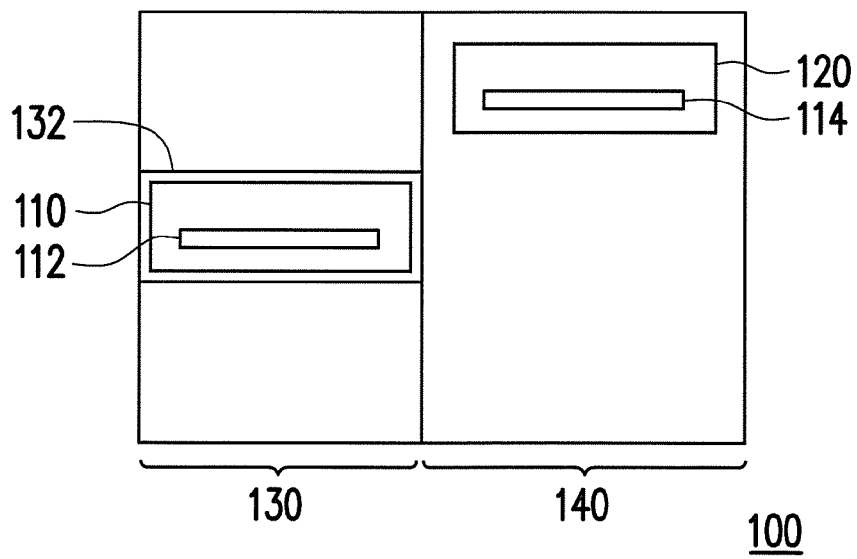

Next, referring to FIG. 1B, a wafer 114 is disposed in the second etching chamber 120. The wafer 114 is disposed in the second etching chamber 120 when the second etching chamber 120 is clean. That is to say, if the second etching chamber 120 previously had byproducts deposited within the second etching chamber 120, the wafer 114 is disposed after the second etching chamber 120 has undergone the cleaning process. If the second etching chamber 120 had not previously had byproducts deposited within the second etching chamber 120, then the second etching chamber 120 is already clean, and the wafer 114 may be disposed in the second etching chamber 120 without the second etching chamber 120 having undergone the cleaning process. Of course, the disclosure is not limited thereto. Even if the second etching chamber 120 is already clean, the second etching chamber 120 may also undergo the cleaning process again if desired by the user.

Figure 1C:
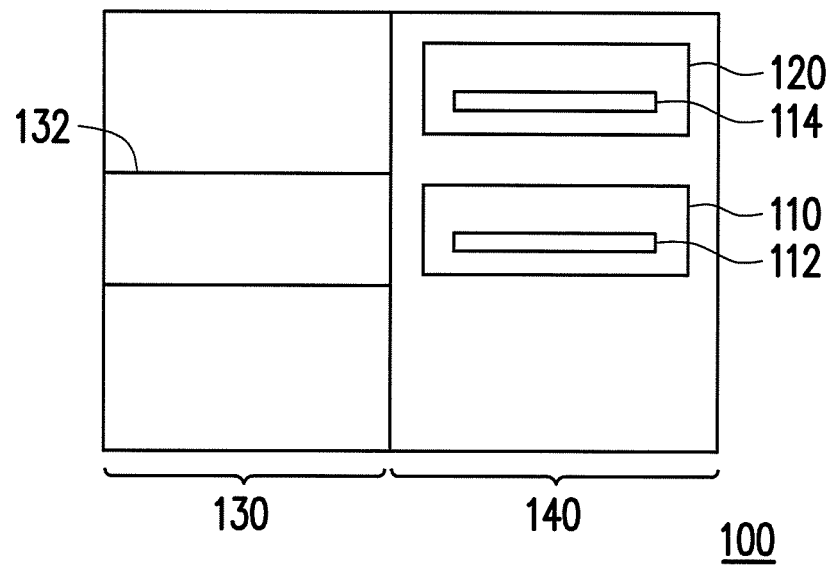

Next, referring to FIG. 1C, after the first etching chamber 110 has completed the wafer etching process by etching the wafer 112 in the etching module 130, the first etching chamber 110 is moved to the transfer module 140. It can be seen in FIG. 1C that the transfer module 140 is disposed adjacent to the etching module 130. Furthermore, in some embodiments, the upper sections, the middle sections, and the lower sections of the etching module 130 and the transfer module 140 are aligned with each other. However, the disclosure is not limited thereto, and the configuration between the etching module 130 and the transfer module 140 may be adjusted according to user requirements. In the step of the semiconductor process shown in FIG. 1C, the first etching chamber 110 is moved to the middle section 140b of the transfer module 140. That is to say, the first etching chamber 110 now moved to the transfer module 140 is aligned with the slot 132 in the etching module 130. Specifically, the first etching chamber 110 is located in the middle section 140b of the transfer module 140, and is aligned with the slot 132 located in the middle section 130b of the etching module 130. The first etching chamber 110 is moved to the middle section 140b of the transfer module 140 through a transfer mechanism of the semiconductor processing device 100. The transfer mechanism may be any type of transfer mechanism suitable to one of ordinary skill in the art. The disclosure does not limit the type of transfer mechanism utilized to move the first etching chamber 110 to the middle section 140b of the transfer module 140. The first etching chamber 110 is moved to the transfer module 140 so as to begin the process of switching the first etching chamber 110 and the second etching chamber 120. That is to say, the first etching chamber 110 has completed the wafer etching process with the wafer 112, and needs to be cleaned. The second etching chamber 120 is clean and disposed with the wafer 114 and ready to proceed with the wafer etching process in the etching module 130. The first etching chamber 110 is moved out of the slot 132 of the etching module 130 and moved to the transfer module 140. This way, the slot 132 in the etching module 130 is vacant so that the second etching chamber 120 may be disposed in the slot 132 of the etching module 130.

Figure 1D:
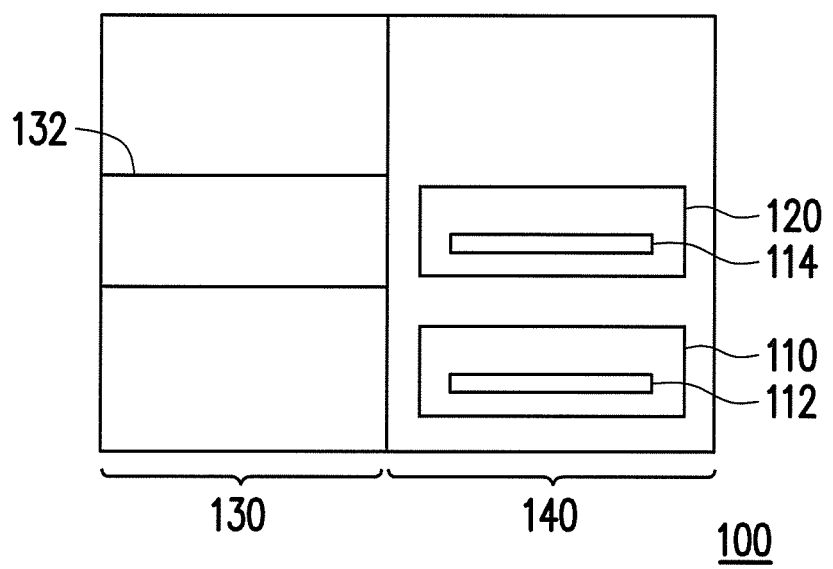

Next, referring to FIG. 1D, the first etching chamber 110 and the second etching chamber 120 are shifted together so that the second etching chamber 120 is in the middle section 140b of the transfer module 140, and the first etching chamber 110 is in the lower section 140c of the transfer module 140. That is to say, in the step of FIG. 1D, the second etching chamber 120 is shifted so as to be aligned with the slot 132 of the etching module 130. As described above, the first etching chamber 110 and the second etching chamber 120 are shifted together. Specifically, the first etching chamber 110 and the second etching chamber 120 are shifted together downwards from the upper section 140a and the middle section 140b to the middle section 140b and the lower section 140c respectively. The first etching chamber 110 and the second etching chamber are shifted together through a transfer mechanism in the transfer module 140. The transfer mechanism for shifting both the first etching chamber 110 and the second etching chamber together may be any suitable type of transfer mechanism for one of ordinary skill in the art. The disclosure does not limit the type of transfer mechanism utilized to shift both the first etching chamber 110 and the second etching chamber together.

Figure 1E:
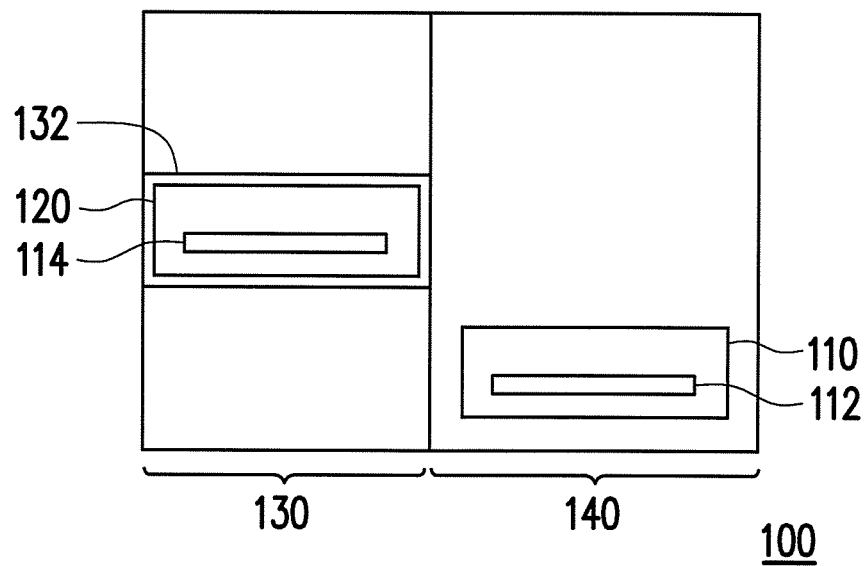

Next, referring to FIG. 1E, the second etching chamber 120 with the wafer 114 is moved from the transfer module 140 into the slot 132 of the etching module 130. That is to say, in the step of FIG. 1E, the semiconductor process has completed the switching process of the second etching chamber 120 and the first etching chamber 110. Specifically, the second etching chamber 120 has moved into the slot 132 of the etching module 130, and is ready to perform the wafer etching process towards the wafer 114. Since the second etching chamber 120 was aligned to the slot 132 in the step of FIG. 1D, the step of FIG. 1E can easily move the second etching chamber 120 into the slot 132. The second etching chamber 120 may be moved into the slot 132 through the same transfer mechanism in the step of FIG. 1C. That is, the transfer mechanism that moved the first etching chamber 110 from the slot 132 to the transfer module 140 in FIG. 1C may be the same transfer mechanism that moves the second etching chamber 120 into the slot 132 of the etching module 130.

Figure 1F:
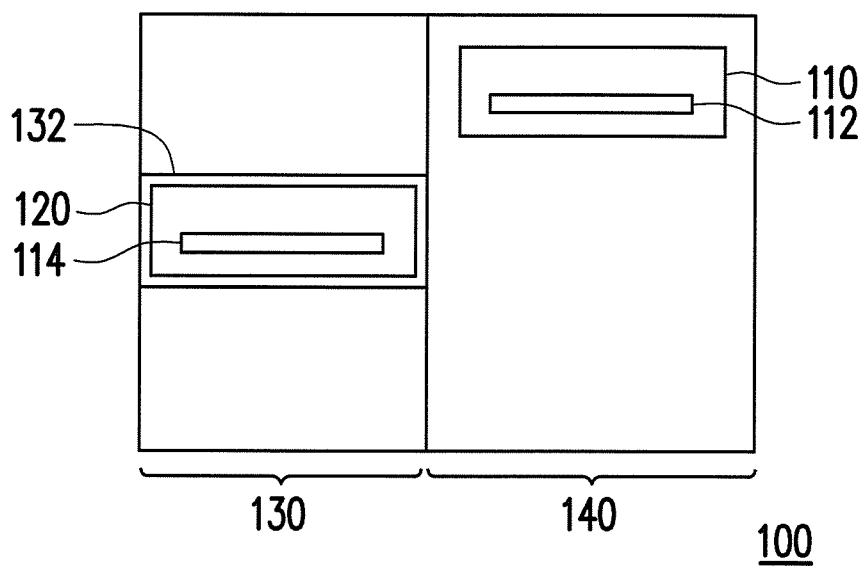

Next, referring to FIG. 1F, the first etching chamber 110 is shifted from the lower section 140c of the transfer module 140 to the upper section 140a of the transfer module 140. The first etching chamber 110 may be shifted through the same transfer mechanism as the step in FIG. 1D. That is to say, the transfer mechanism that shifted the first etching chamber 110 and the second etching chamber 120 together downwards in FIG. 1D may also shift the first etching chamber 110 in FIG. 1F. As described above, the cleaning process towards the etching chamber in the transfer module 140 may be performed in the upper section 140a of the transfer module 140. Thus, the first etching chamber 110 is shifted up from the lower section 140c to the upper section 140a of the transfer module 140. This way, the first etching chamber 110 may be in the suitable location of the transfer module 140 to undergo the cleaning process. However, the disclosure is not limited thereto. The user may select the cleaning process of the etching chamber in the transfer module 140 to be in any section or a combination of any of the sections. If the cleaning process is selected to be in the lower section 140c of the transfer module 140, then the step of shifting the first etching chamber 110 in FIG. 1F may be omitted.

Figure 1G:
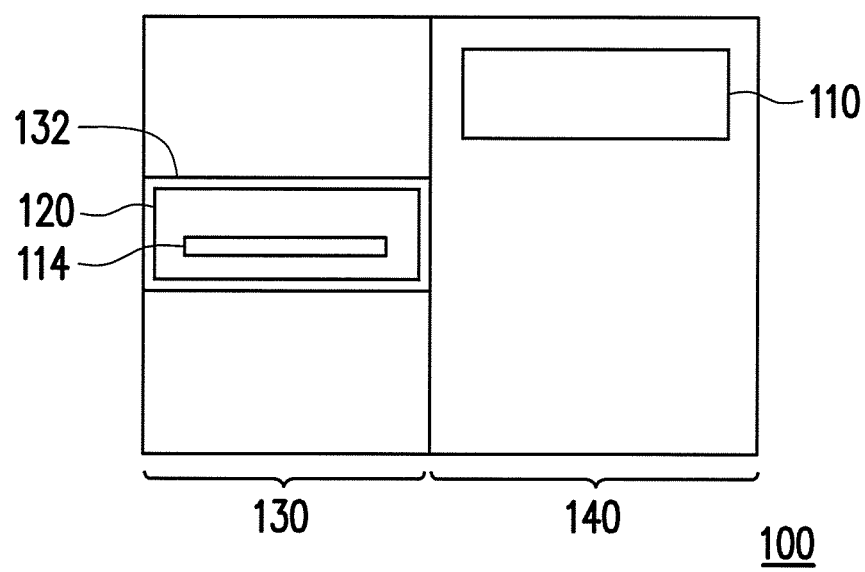

Next, referring to FIG. 1G, the wafer 112 which has completed the wafer etching process in the first etching chamber 110 is removed. This way, the first etching chamber 110 is in a waferless state, and can undergo the cleaning process in the transfer module 140. It should be noted that during the steps of FIG. 1E, FIG. 1F, and FIG. 1G, the etching module 130 may perform the wafer etching process towards the wafer 114 disposed in the second etching chamber 120. The disclosure does not limit when the etching process is performed towards the wafer 114. Since the second etching chamber 120 is disposed in the slot 132 in FIG. 1E, FIG. 1F, and FIG. 1G, the etching process may take place any time in those steps. In some embodiments, the etching process towards the wafer 114 is performed in the step of FIG. 1G. This way, after the wafer 112 has been removed from the first etching chamber 110, the first etching chamber 110 may be cleaned at the same time the wafer 114 is being etched. This reduces the non-productivity time of the etching module 130, and the wafer etching process may be more efficient and productive in the etching module 130.

In some embodiments, the cleaning process in the transfer module 140 is not located in the upper section 140a of the transfer module 140, but may be located in the middle section 140b or the lower section 140c of the transfer module 140. As a result, how the first etching chamber 110 and the second etching chamber 120 are shifted and moved may be different from the way described in FIG. 1A to FIG. 1F. That is to say, the order and the sequence of arranging the first etching chamber 110 and the second etching chamber 120 to switch positions may be adjusted according to where the cleaning process in the transfer module 140 takes place.

Furthermore, in some embodiments, the semiconductor process may omit the transfer module 140. That is, the first etching chamber 110 and the second etching chamber 120 may be switched in the slot 132 of the etching module 130 without the use of the transfer module 140. The first etching chamber 110 and the second etching chamber 120 may be switched manually or through any other suitable manual or automatic machine. The first etching chamber 110 and the second etching chamber 120 that is switched out and to be cleaned may be moved to a suitable machine for the cleaning process, and is not limited to being cleaned in the transfer module 140.

After the step in FIG. 1G, the semiconductor process may be repeated to return to the step in FIG. 1A. The difference between FIG. 1G and FIG. 1A is the position of the first etching chamber 110 and the second etching chamber 120. That is, in FIG. 1A, the first etching chamber 110 is in the etching module 130 and the wafer 112 may be being etched, and the second etching chamber 120 is in the upper section 140a of the transfer module 140 may be being cleaned in a waferless state. In FIG. 1G, the second etching chamber 120 is in the etching module 130 and the wafer 114 may be being etched, and the first etching chamber 110 is in the upper section 140a of the transfer module 140 may be being cleaned in a waferless state. The semiconductor process is repeated except the description for the first etching chamber 110 and the second etching chamber 120 is switched in each of the FIGS. 1A to 1G. The description will not be repeated herein. It should be noted that a next wafer to be etched is disposed in the first etching chamber 110 after the first etching chamber 110 is cleaned, and the process of switching the first etching chamber 110 and the second etching chamber 120 continues. That is, when the wafer 114 has been etched, the second etching chamber 120 and the first etching chamber 110 switch positions again, and after the wafer 114 is removed, the second etching chamber 120 is cleaned again and the another wafer that is to be etched next is disposed in the second etching chamber 120. This semiconductor process continues etching wafers in one of the etching chambers and cleaning the other etching chamber. By using two identical etching chambers that may switch places in the etching module 130, the cleaning process and the wafer etching process may take place at the same time, reducing non-productivity time.

Figure 2:
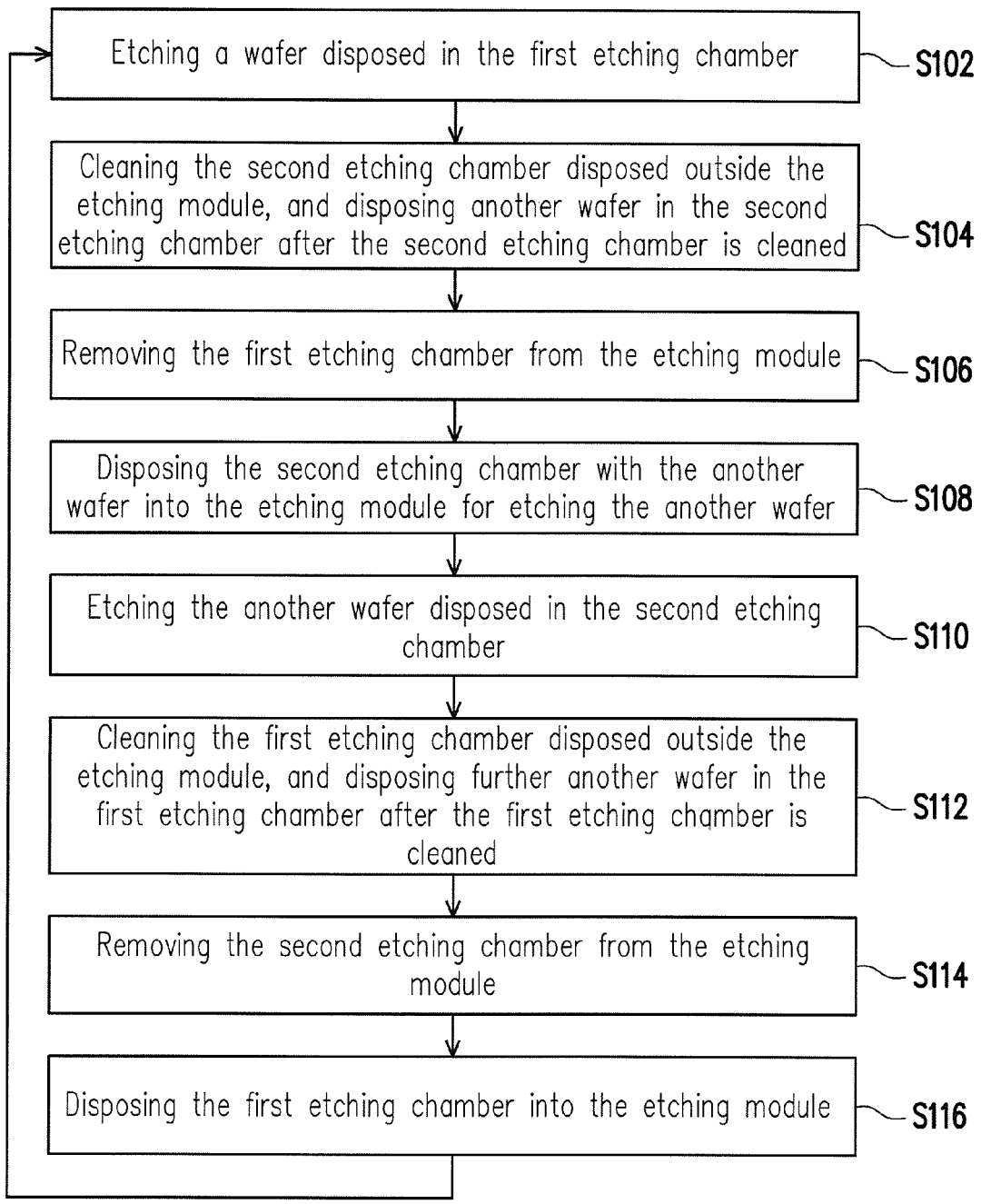
FIG. 2 is a flow chart showing the steps of a semiconductor process according to some embodiments of the present disclosure.

FIG. 2 is a flow chart showing the steps of a semiconductor process according to some embodiments of the present disclosure. In step S102, a wafer disposed in the first etching chamber 110 is etched to produce an etched wafer, wherein the first etching chamber 110 is disposed in the etching module 130. In step S104, the second etching chamber 120 disposed outside the etching module 130 is cleaned, and another wafer is disposed in the second etching chamber 120 after the second etching chamber 120 is cleaned. In some embodiments, the second etching chamber 120 is cleaned simultaneously while the wafer in the first etching chamber 110 is etched in the etching module 130. However, the disclosure is not limited thereto, and the steps S102 and S104 may be performed at different times (i.e. step S102 may be performed before or after step S104). Next, in step S106, the first etching chamber 110 with the etched wafer is removed from the etching module 130. Next, in step S108, the second etching chamber 120 with the another wafer is disposed into the etching module 130 for etching the another wafer. Next, in step S110, the another wafer disposed in the second etching chamber 120 is etched to produce another etched wafer, wherein the second etching chamber 120 is disposed in the etching module 130. In step S112, the first etching chamber 110 disposed outside the etching module 130 is cleaned, and further another wafer is disposed in the first etching chamber 110 after the first etching chamber 110 is cleaned. In some embodiments, the first etching chamber 110 is cleaned simultaneously while the another wafer in the second etching chamber 120 is etched in the etching module 130. However, the disclosure is not limited thereto, and the steps S110 and S112 may be performed at different times (i.e. step S110 may be performed before or after step S112). Next, in step S114, the second etching chamber 120 with the another etched wafer is removed from the etching module 130. Next, in step S116, the first etching chamber 110 with the further another wafer is disposed into the etching module 130 for etching the further another wafer. Next, the semiconductor process may be repeated, and the steps S102 to S116 are repeated.

In some embodiments, in step S104, the second etching chamber 120 is cleaned in the transfer module 140, and in step S112, the first etching chamber 110 is cleaned in the transfer module 140. In step S106 and in step S108, the first etching chamber 110 with the etched wafer is moved from the etching module 130 to the transfer module 140 and aligned with the slot 132. The second etching chamber 120 is moved from the transfer module 140 to the etching module 130. In step S114 and step S116, the second etching chamber 120 with the another etched wafer is moved from the etching module 130 to the transfer module 140 and aligned with the slot 132. The first etching chamber 110 is moved from the transfer module 140 to the etching module 130. Before step S108, the second etching chamber 120 and the first etching chamber 110 are shifted together so that the second etching chamber 120 is aligned with the slot 132. Before step S116, the second etching chamber 120 and the first etching chamber 110 are shifted together so that the first etching chamber 110 is aligned with the slot 132. The description of how the transfer module 140 is utilized and how the first etching chamber 110 and the second etching chamber 120 is moved and shifted can be referred to in the above descriptions. The same descriptions will not be repeated herein.

Figure 3:
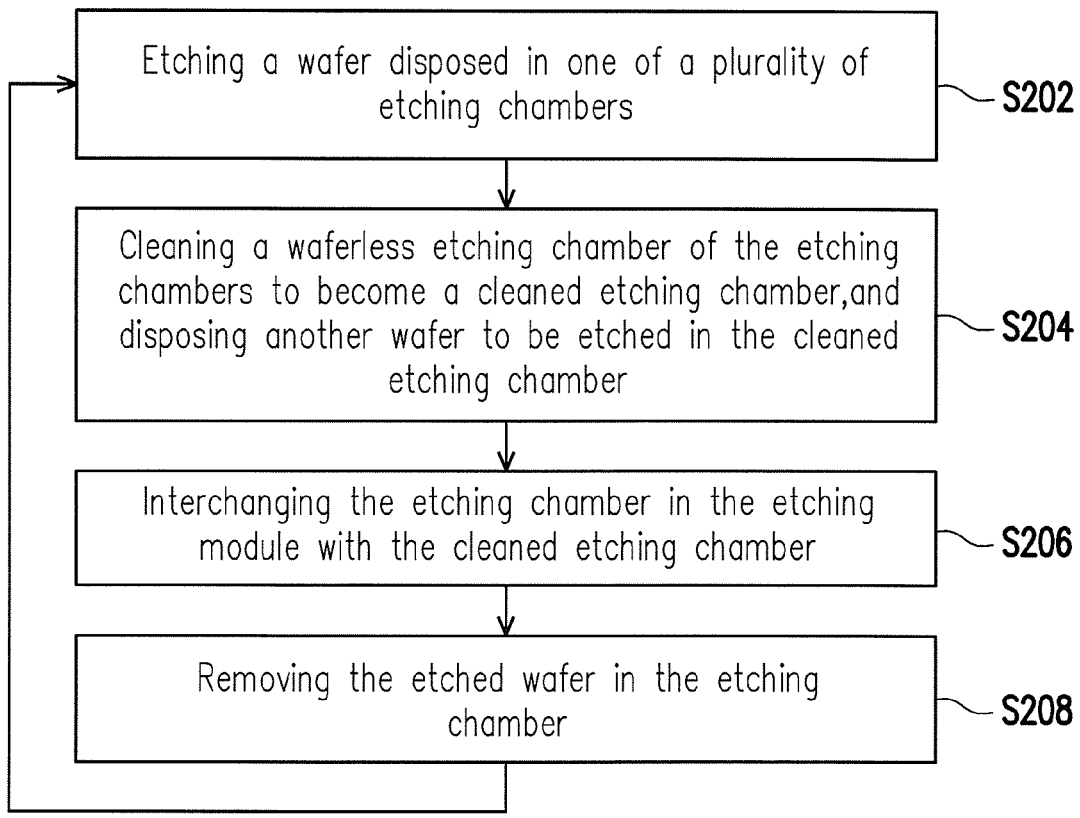
FIG. 3 is a flow chart showing the steps of a semiconductor process according to some other embodiments of the present disclosure.

FIG. 3 is a flow chart showing the steps of a semiconductor process according to some other embodiments of the present disclosure. In step S202, a wafer disposed in one of a plurality of etching chambers is etched to produce an etched wafer, wherein the wafer is etched in the etching module 130. In step S204, a waferless etching chamber of the etching chambers is cleaned to become a cleaned etching chamber, wherein the waferless etching chamber is disposed outside the etching module 130, and another wafer to be etched is disposed in the cleaned etching chamber. In some embodiments, the step S202 and the step S204 are performed simultaneously. However, the disclosure is not limited thereto, and the steps S202 and S204 may be performed at different times (i.e. step S202 may be performed before or after step S204). Next, in step S206, the etching chamber with the etched wafer is interchanged with the cleaned etching chamber with the another wafer, so that the cleaned etching chamber is disposed in the etching module 130 for the another wafer to be etched and the etching chamber with the etched wafer is disposed outside the etching module 130 to be cleaned. Next, in step S208, the etched wafer in the etching chamber is removed. Next, the semiconductor process may be repeated, and steps S202 to S208 are repeated.

In some embodiments, in step S204, the waferless etching chamber disposed outside the etching module 130 is cleaned in the transfer module 140. In step S206, the etching chamber with the etched wafer is moved from the etching module 130 to the transfer module 140, and the cleaned etching chamber is moved from the transfer module 140 to the etching module 130. Furthermore, in step S206, the etching chamber with the etched wafer and cleaned etching chamber are shifted together in the transfer module 140, so that the cleaned etching chamber is aligned with the slot 132 of the etching module 130 and then moved into the slot 132 of the etching module 130. The description of how the transfer module 140 is utilized and how the etching chambers are moved and shifted can be referred to in the above descriptions. The same descriptions will not be repeated herein.

According to some embodiments, a semiconductor process is provided. The semiconductor process includes the following steps. A wafer disposed in a first etching chamber is etched to produce an etched wafer, wherein the first etching chamber is disposed in an etching module. A second etching chamber disposed outside the etching module is cleaned and another wafer is disposed in the second etching chamber after the second etching chamber is cleaned. The first etching chamber with the etched wafer is removed from the etching module. The second etching chamber with the another wafer is disposed into the etching module for etching the another wafer.

According to some embodiments, a semiconductor process is provided. The semiconductor process includes the following steps. A wafer disposed in one of a plurality of etching chambers is etched to produce an etched wafer, wherein the wafer is etched in an etching module. A waferless etching chamber of the etching chambers is cleaned to become a cleaned etching chamber, wherein the waferless etching chamber is disposed outside the etching module, and another wafer to be etched is disposed in the cleaned etching chamber. The etching chamber with the etched wafer is interchanged with the cleaned etching chamber with the another wafer, so that the cleaned etching chamber is disposed in the etching module for the another wafer to be etched and the etching chamber with the etched wafer is disposed outside the etching module to be cleaned. The etched wafer in the etching chamber is removed. The aforementioned steps may be repeated to repeat the semiconductor process.

According to some embodiments, a semiconductor processing device is provided. The semiconductor processing device includes a first etching chamber, a second etching chamber, and an etching module. The etching module is adapted to interchangeably contain the first etching chamber or the second etching chamber for wafer etching.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process, comprising:
    (a) etching a wafer disposed in a first etching chamber to produce an etched wafer, wherein the first etching chamber is disposed in an etching module;
    (b) cleaning a second etching chamber disposed outside the etching module and disposing another wafer in the second etching chamber after the second etching chamber is cleaned;
    (c) removing the first etching chamber with the etched wafer from the etching module; and
    (d) disposing the second etching chamber with the another wafer into the etching module for etching the another wafer.

2. The process as claimed in claim 1, further comprising:
    (e) etching the another wafer disposed in the second etching chamber to produce another etched wafer, wherein the second etching chamber is disposed in the etching module;
    (f) cleaning the first etching chamber disposed outside the etching module and disposing further another wafer in the first etching chamber after the first etching chamber is cleaned;
    (g) removing the second etching chamber with the another etched wafer from the etching module; and
    (h) disposing the first etching chamber with the further another wafer into the etching module for etching the further another wafer.

3. The process as claimed in claim 2, wherein the etching module comprises a slot adapted to contain one of the first etching chamber and the second etching chamber.

4. The process as claimed in claim 3, wherein in step (b), the second etching chamber is cleaned in a transfer module, and in step (f), the first etching chamber is cleaned in the transfer module.

5. The process as claimed in claim 4, wherein in step (c), the first etching chamber with the etched wafer is moved from the etching module to the transfer module and aligned with the slot, and in step (g), the second etching chamber with the another etched wafer is moved from the etching module to the transfer module and aligned with the slot.

6. The process as claimed in claim 5, wherein in step (d), the second etching chamber is moved from the transfer module to the etching module, and in step (h), the first etching chamber is moved from the transfer module to the etching module.

7. The process as claimed in claim 6, wherein before step (d), the second etching chamber and the first etching chamber are shifted together so that the second etching chamber is aligned with the slot.

8. The process as claimed in claim 6, wherein before step (h), the second etching chamber and the first etching chamber are shifted together so that the first etching chamber is aligned with the slot.

9. The process as claimed in claim 2, wherein in step (f), the first etching chamber is cleaned simultaneously while the another wafer in the second etching chamber is etched in the etching module.

10. The process as claimed in claim 1, wherein in step (b), the second etching chamber is cleaned simultaneously while the wafer in the first etching chamber is etched in the etching module.

11. A semiconductor process comprising:
    (a) etching a wafer disposed in one of a plurality of etching chambers to produce an etched wafer, wherein the wafer is etched in an etching module;
    (b) cleaning a waferless etching chamber of the etching chambers to become a cleaned etching chamber, wherein the waferless etching chamber is disposed outside the etching module, and disposing another wafer to be etched in the cleaned etching chamber;

(c) interchanging the etching chamber with the etched wafer with the cleaned etching chamber with the another wafer, so that the cleaned etching chamber is disposed in the etching module for the another wafer to be etched and the etching chamber with the etched wafer is disposed outside the etching module to be cleaned; and (d) removing the etched wafer in the etching chamber.

12. The process as claimed in claim 11, wherein the etching module comprises a slot adapted to contain one of the etching chambers.

13. The process as claimed in claim 12, wherein in step (b), the waferless etching chamber disposed outside the etching module is cleaned in a transfer module.

14. The process as claimed in claim 13, wherein in step (c), the etching chamber with the etched wafer is moved from the etching module to the transfer module, and the cleaned etching chamber is moved from the transfer module to the etching module.

15. The process as claimed in claim 14, wherein in step (c), the etching chamber with the etched wafer is moved to the transfer module, and the etching chamber with the etched wafer and cleaned etching chamber are shifted together in the transfer module, so that the cleaned etching chamber is aligned with the slot of the etching module and then moved into the slot of the etching module.

16. The process as claimed in claim 11, wherein step (a) and step (b) are performed simultaneously.

* * * * *